United States Patent
Yamada

(10) Patent No.: US 6,847,322 B2
(45) Date of Patent: Jan. 25, 2005

(54) SEQUENTIAL COMPARISON TYPE AD CONVERTER AND MICROCOMPUTER

(75) Inventor: Susumu Yamada, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/721,746

(22) Filed: Nov. 26, 2003

(65) Prior Publication Data

US 2004/0130474 A1 Jul. 8, 2004

(30) Foreign Application Priority Data

Nov. 28, 2002 (JP) ........................................ 2002-345110

(51) Int. Cl.[7] .............................................. H03M 1/38
(52) U.S. Cl. ........................ 341/161; 341/155; 341/150
(58) Field of Search ................................. 341/155, 156, 341/161, 118, 150, 172, 158, 154

(56) References Cited

U.S. PATENT DOCUMENTS 6,304,203 B1 * 10/2001 Yamada ...................... 341/159

* cited by examiner

Primary Examiner—Brian Young
Assistant Examiner—John B Nguyen
(74) Attorney, Agent, or Firm—Fish & Richardson P.C.

(57) ABSTRACT

A sequential comparison type AD converter comprising series resistors for generating at respective connection portions reference values to convert an analog value to an m-bit digital value; a comparator for sequentially comparing the analog value and one of the reference value and outputting a digital value; a plurality of capacitive elements for distributing any one of the reference values by capacitance ratio; and a control unit for switching a value compared to the analog value by the comparator from a reference value to a distribution value of the plurality of capacitive elements when the comparator outputs an m-bit digital value, wherein the analog value is converted to an (m+n) bit digital value.

5 Claims, 2 Drawing Sheets

SEQUENTIAL COMPARISON TYPE AD CONVERTER AND MICROCOMPUTER

CROSS-REFERENCE TO RELATED APPLICATIONS

The present application claims priority upon Japanese Patent Application No. 2002-345110 filed on Nov. 28, 2002, which is herein incorporated by reference.

BACKGROUND OF THE INVENTION

1. Field of the Invention

The present invention relates to a sequential comparison type AD converter and microcomputer.

2. Description of the Related Art

A sequential comparison type AD converter has series resistors and is designed to sequentially compare a reference value and analog value generated at each connection portion of these series resistors, by a method of ½ approximation, to convert the analog value into an m-bit digital value. The series resistors consist of $2^m$ resistors which are connected in series depending on the conversion accuracy (e.g., m bits) of the sequential comparison type AD converter. That is, together with improvement of the conversion accuracy (resolution) of the sequential comparison type AD converter, the number of series resistors increases dramatically by the power. For example, if the conversion accuracy of the sequential comparison type AD converter is improved from 8 to 10 bits, then the number of series resistors increases from 256 to 1024. Consequently, in the sequential comparison type AD converter, because the number of series resistors is large, this results in the problem that pattern area of the series resistors and the production cost increase in addition, there is the problem that in the microcomputer in which the sequential comparison type AD converter is incorporated, the chip area increases.

The applicant of the present invention has filed the application of a sequential comparison type AD converter aiming to solve the above problems (see e.g., Japanese Patent Application Laid-open Publication No. 2001-53612). This sequential comparison type AD converter improves conversion accuracy by connecting in parallel a plurality of capacitive elements between a ground and an input of a comparator where a reference value is input, and using as the reference value an average value of the charging voltages of the plurality of capacitive elements.

However, in the sequential comparison type AD converter of Japanese Patent Application Laid-open Publication NO. 2001-53612, although the increase in the number of series resistors arising from improvement of conversion accuracy can be prevented, it is necessary to suitably control the charging timing of the plurality of capacitive elements, thus resulting in the problems that the number of control elements for controlling the timing increases and that required control becomes complex.

SUMMARY OF THE INVENTION

In order to overcome the above deficiencies, one aspect of the present invention provides a sequential comparison type AD converter comprising series resistors for generating at respective connection portions reference values to convert an analog value to an m-bit digital value; a comparator for sequentially comparing the analog value and one of the reference value and outputting a digital value; a plurality of capacitive elements for distributing any one of the reference values by a capacitance ratio; and a control unit for switching a value compared to the analog value by the comparator from the reference value to a distribution value of the plurality of capacitive elements when the comparator outputs an m-bit digital value, wherein the analog value is converted to an (m+n) bit digital value.

BRIEF DESCRIPTION OF THE DRAWINGS

These and other features, aspects and advantages of the present invention will become better understood with reference to the following description, appended claims and accompanying drawings in which:

DETAILED DESCRIPTION OF THE INVENTION

Figure 1:
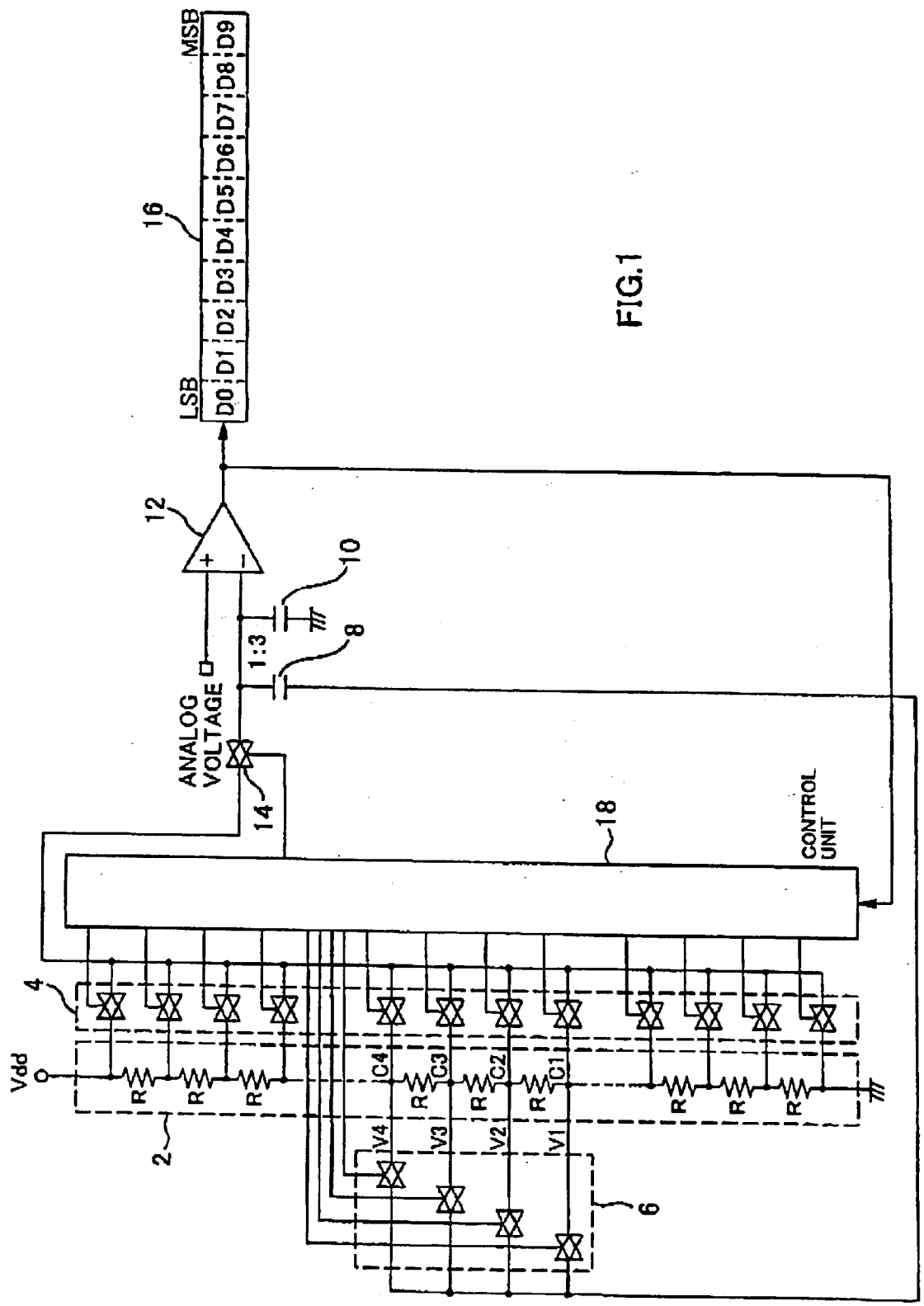
FIG. 1 is a diagram showing a sequential comparison type AD converter of the present invention.

At least the following items will become apparent from descriptions of this specification and of the accompanying drawings.

A sequential comparison type AD converter comprising series resistors for generating at respective connection portions reference values to convert an analog value to an m-bit digital value; a comparator for sequentially comparing the analog value and one of the reference value and outputting a digital value; a plurality of capacitive elements for distributing any one of the reference values by a capacitance ratio; and a control unit for switching a value compared to the analog value by the comparator from the reference value to a distribution value of the plurality of capacitive elements when the comparator outputs an m-bit digital value, wherein the analog value is converted to an (m+n) bit digital value. According to this sequential comparison type AD converter, the value compared to the analog value by the comparator is changed from the reference value of the series resistors to a distribution value of the plurality of capacitive elements, and a digital value of lower n bits after m bits is obtained with the resulting simple structure that uses the distribution value of the plurality of capacitive elements, the conversion accuracy of the sequential comparison type AD converter can be reliably improved. Incidentally, the number of series resistors does not increase even when the conversion accuracy of the sequential comparison type AD converter is improved.

In such a sequential comparison type AD converter, the plurality of capacitive elements can distribute by the capacitance ratio the difference of reference values generated at predetermined connection portions of the series resistors. According to this sequential comparison type AD converter, because the predetermined reference value difference (minimum unit potential difference) of the series resistors is broken down by a capacitance ratio, the conversion accuracy of the sequential comparison type AD converter can be reliably improved.

In such a sequential comparison type AD converter, the plurality of capacitive elements can comprise a first capacitance element and a second capacitance element, wherein the first capacitance element and second capacitance element are connected in series between any one of the reference values and a ground, and wherein connection portions of the first capacitance element and second capacitance element are connected to inputs of the comparator to which the analog value is not input. According to this sequential comparison type AD converter, the conversion accuracy of the sequential comparison type AD converter can be reliably improved with a simple structure that uses two capacitive elements.

In such a sequential comparison type AD converter, the capacitance ratio of the first capacitance element and second capacitance element can be $1:(2^n-1)$, in accordance with the (m+n) bits. According to this sequential comparison type AD converter, the conversion accuracy of the sequential comparison type AD converter can easily be changed by setting the capacitance ratio of the two capacitive elements to the above value.

Such a sequential comparison type AD converter can further comprise a switching circuit for switching on and off input of the reference value to the comparator, based on an output of the control unit. According to this sequential comparison type AD converter, the reference value of the series resistors and the distribution value of the plurality of capacitive elements can be reliably changed.

A microcomputer comprises the above sequential comparison type AD converter. According to this microcomputer, a sequential comparison type AD converter having high conversion accuracy can be formed on a chip having a small surface area.

Structure of the Sequential Comparison Type AD Converter

Referring to FIG. 1, the structure of the sequential comparison type AD converter of the present invention will be explained. FIG. 1 is a diagram showing the sequential comparison type AD converter of the present invention. In this embodiment, the sequential comparison type AD converter has a conversion accuracy of 10 bits. For example, this sequential comparison type AD converter obtains an 8-bit digital value based on the reference value of the series resistors, and a 2-bit digital value based on the distribution value of the plurality of capacitive elements.

In FIG. 1, the series resistors 2 generate a standard voltage (reference value), which is to be compared to an analog voltage (analog value), at each connection portion. That is, the series resistors 2 connect in series 256 ($=2^8$) resistors having a resistance value R between a power supply Vdd and a ground, and generate partial voltages at each connection portion as standard voltages.

Transmission gates 4 correspond one-to-one with the connection portions of the series resistors 2. That is, the standard voltage generated in each of the connection portions of the series resistors 2 is supplied to one end of each transmission gate 4. Then, by sequentially switching on any one of the transmission gates 4 using a method of ½ approximation according to the output of the comparator (to be described later), a corresponding 8 level standard voltage can be obtained from the other end of the transmission gate 4. With the sequential comparison type AD converter of this embodiment, 8-bit (m-bit) digital values D9 (highest bit MSB) to D2 are obtained based on this 8 level standard voltage.

Transmission gates 6 correspond one-to-one with four continuous connection portions C1 to C4 of the series resistors 2. That is, standard voltages V1 to V4 generated in the connection portions C1 to C4 are supplied to one end of the transmission gates 6. Also, while the sequential comparison type AD converter is obtaining digital values D9 to D2, the transmission gate 6 corresponding to the connection portion C1 of the series resistors 2 is on, and only the standard voltage V1 can be obtained from the other end of the transmission gate 6. Then, after the sequential comparison type AD converter has obtained the digital values D9 to D2, the transmission gates 6 are switched on and off according to the output of the comparator, whereby standard voltages V2 to V4 can be obtained in suitable sequence from the other ends of the transmission gates 6. In the sequential comparison type AD converter of this embodiment, 2-bit (n-bit) digital values D1 and D0 (lowest bit LSB) are obtained based on the 4 level standard voltages V1 to V4. The transmission gates 6 may also be used in common with some of the transmission gates 4. Also, the connection portions C1 to C4 of the series resistors 2 need not be limited to the positions shown in FIG. 1. As long as they are four continuous connection portions, they can be connection portions at any position among the series resistors 2. Also, the standard voltages V1 to V4 can be obtained from series resistors (not shown) other than the series resistors 2.

A capacitor 8 (first capacitance element) and capacitor 10 (second capacitance element) have a capacitance ratio of 1:3 ($1:(2^n-1)$) and are connected in series between the common other ends of the transmission gates 6 and a ground. The capacitors 8 and 10 divide difference voltages (changes) obtained from the other ends of the four transmission gates 6 by the capacitance ratio, by switching the four transmission gates 6 on and off in a suitable sequence. Partial voltages of the difference voltage can thereby be obtained from the connection portions of the capacitors 8 and 10. For example, since the resistance values R of the resistors among the series resistors 2 are equal, the potential difference of each of the resistors is $\Delta V$. At that time, from the other ends of the transmission gates 6 are obtained difference voltages $\Delta V$ and $2\Delta V$, and from the connection portions of the capacitors 8 and 10 are obtained partial voltages $\Delta V/4$, $\Delta V/2$, $3\Delta V/4$, which are voltages broken down from the voltage difference $\Delta V$ of one resistor. Details of the operations of the capacitors 8 and 10 will be explained below.

The + (non-inverse input) terminal of a comparator 12 is a terminal to which an analog voltage is input. The − (inverse input) terminal of the comparator 12, as well as being connected in common to the other ends of the transmission gates 4 via a transmission gate 14, is also connected to the connection portions of the capacitors 8 and 10. That is, the comparator 12, when the transmission gate 14 (switching circuit) is on, outputs the digital values D9 to D2 by comparing the magnitude of the analog voltage and the standard voltage that passes through the transmission gates 4, and when the transmission gate 14 is off, the comparator 12 outputs the digital values D1 and D0 by comparing the analog voltage and the partial voltage of the connection portions of the capacitors 8 and 10. The register 16 holds the 10-bit digital values D9 to D0 obtained from the comparator 12.

The control unit 18 has the digital value of each bit obtained from the comparator 12 sequentially input, and according to the logics of these digital values ("1" or "0") controls the on and off states of the transmission gates 4, 6, and 14. The control unit 18, in its initial state, switches on the transmission gates 4 corresponding to an intermediate voltage vdd/2 of the power supply voltage Vdd while switching on the transmission gate 14. The comparator 12 thereby outputs the highest bit digital value D9. Thereafter, the control unit 18 selectively switches on one of the transmission gates 4 by a method of ½ approximation according to the logic of the next highest bit digital value obtained from the comparator 12. The comparator 12 thereby outputs the digital values D8 to D2. Then, the control unit 18, as well as switching off the transmission gate 14 according to the digital value D2 obtained from the comparator 12, selectively switches on the transmission gates 6 by the method of ½ approximation according to the logic of the next highest digital value obtained from the comparator 12. The comparator 12 thereby outputs the digital values D1 and D0.

Operation of Sequential Comparison Type AD Converter

Figure 2:
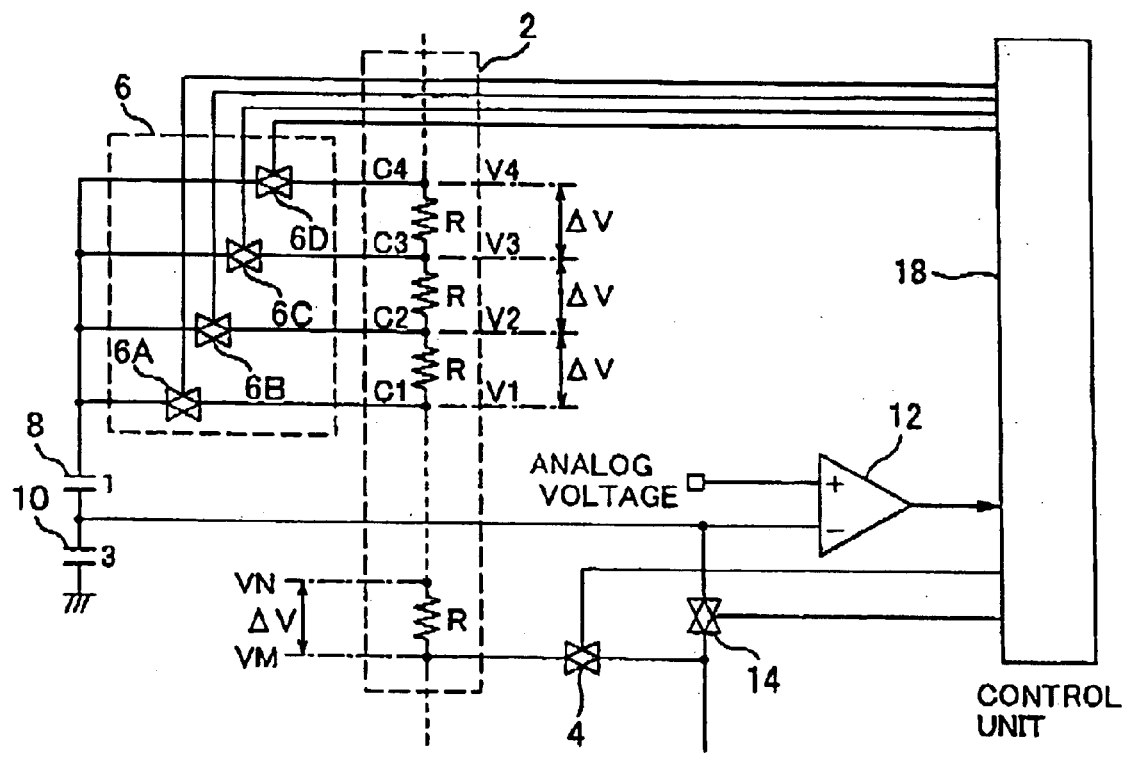
FIG. 2 is a diagram showing the main components of the sequential comparison type AD converter of the present invention.

Next, the operation of the sequential comparison type AD converter of the present invention will be described with reference to FIG. 2. FIG. 2 is a diagram showing the main components of the sequential comparison type AD converter of the present invention. The operation by which the comparator 12 outputs the digital values D9 to D2 is the same as that for sequential comparison type AD converters of the prior art and therefore will be omitted here.

Firstly, the control unit 18 switches on the transmission gate 4 corresponding to a standard voltage VM according to the logic of the next highest bit digital value D3 obtained from the comparator 12. At that time, the voltage of the connection portions of the capacitors 8 and 10 is held at the standard voltage VM. Also, the comparator 12, based on the comparison result of the magnitude of the analog voltage and the standard voltage VM, outputs the digital value D2 to the control unit 18. The analog voltage thereby exists between the difference voltages $\Delta V$ of the standard voltage VM and a standard voltage VN.

The control unit 18 switches off the transmission gates 4 and 14 due to the digital value D2 being supplied from the comparator 12. That is, it switches the standard voltage of the series resistors 2 and the partial voltage of the capacitors 8 and 10. The standard voltage generated in the connection portions of the series resistors 2 is thereby no longer supplied to a terminal of the comparator 12. Also, the control unit 18 switches off the transmission gate 6A while switching on the transmission gate 6C. At that time, the difference voltage at the other ends of the transmission gates 6A to 6D becomes $2\Delta V$ (=V3−V1). The capacitors 8 and 10 divide this difference voltage $2\Delta V$ by the capacitance ratio 1:3 to obtain a partial voltage $\Delta V/2$. An intermediate voltage (VM+$\Delta V/2$) between the standard voltage VM and the standard voltage VN is thereby obtained from the connection portions of the capacitors 8 and 10 as a new standard voltage. The comparator 12 outputs to the control unit 18 a digital value D1 having a logic of either "1" or "0" based on a comparison result of the magnitudes of the analog voltage and the standard voltage (VM+$\Delta V/2$).

When the logic of the digital value D1 is "1", the analog voltage exists between the difference voltages $\Delta V/2$ of the reference value (VM+$\Delta V/2$) and the reference value VN. The control unit 18 switches off the transmission gate 6C and switches on the transmission gate 6D due to the digital value D1 with a logic of "1" being supplied from the comparator 12. At that time, the difference voltage at the other ends of the transmission gates 6A to 6D becomes $\Delta V$(=V4−V3). The capacitors 8 and 10 obtain a partial voltage $\Delta V/4$ by dividing the difference voltage $\Delta V$ by the capacitance ratio 1:3. An intermediate voltage (VM+$3\Delta V/4$) between the standard voltage (VM+$\Delta V/2$) and the standard voltage VN is thereby obtained from the connection portions of the capacitors 8 and 10 as a new standard voltage. The comparator 12 outputs to the control unit 18 a digital value D0 having a logic of either "1" or "0" based on a comparison result of the magnitudes of the analog voltage and the standard voltage (VM+$3\Delta V/4$).

On the other hand, when the logic of the digital value D1 is "0", the analog voltage exists between the difference voltages $\Delta V/2$ of the reference value VM and the reference value (VM+$\Delta V/2$). The control unit 18 switches off the transmission gate 6C and switches on the transmission gate 6B due to the digital value D1 with a logic of "0" being supplied from the comparator 12. At that time, the difference voltage at the other ends of the transmission gates 6A to 6D becomes $-\Delta V$(=V2−V3). The capacitors 8 and 10 obtain a partial voltage $-\Delta V/4$ by dividing the difference voltage $-\Delta V$ by the capacitance ratio 1:3. An intermediate voltage (VM+$\Delta V/4$) between the standard voltage VM and the standard voltage (VM+$\Delta V/2$) is thereby obtained from the connection portions of the capacitors 8 and 10 as a new standard voltage. The comparator 12 outputs to the control unit 18 the digital value D0 having a logic of either "1" or "0" based on a comparison result of the magnitudes of the analog voltage and the standard voltage (VM+$\Delta V/4$).

In the control unit 18, the operation is stopped by the lowest bit digital value D0 being supplied from the comparator 12. 10-bit digital values D5 to D0 can thereby be obtained from an analog voltage.

In the above manner, by suitably setting the capacitance ratio of the two capacitors, the conversion accuracy of the sequential comparison type AD converter can be reliably improved from 8-bit to 10-bit.

Application to Microcomputers

The sequential comparison type AD converter of this embodiment attains high conversion precision using the capacitance ratio of two capacitors. A microcomputer incorporating the sequential comparison type AD converter can thereby be constructed with a sequential comparison type AD converter having high conversion precision formed on a chip with a small surface area. Also, because it uses the capacitance ratio of two capacitors, a capacity can be set that can integrate approximately several pFs.

The sequential comparison type AD converter and microcomputer according to the present invention have been described above, but since the above embodiment of the present invention was for the purpose of easily understanding the present invention, the present invention is not limited thereto. The present invention can be modified and improved without departing from the scope thereof, and the present invention naturally includes similar articles.

Capacitance Ratio of Capacitive Elements

In this embodiment, the capacitance ratio of the capacitors 8 and 10 is 1:3, but it is not limited to this. In other words, the capacitance ratio of the capacitors 8 and 10 can be set to $1:(2^n-1)$ according to the conversion accuracy of the sequential comparison type AD converter. For example, when improving the conversion accuracy of the sequential comparison type AD converter by 3 bits, the capacitance ratio of the capacitors 8 and 10 is 1:7. Also, when improving the conversion accuracy of the sequential comparison type AD converter by 4 bits, the capacitance ratio of the capacitors 8 and 10 is 1:15. The conversion accuracy of the sequential comparison type AD converter can thereby be easily changed by suitably setting the capacitance ratio of the capacitors 8 and 10 and the number of transmission gates 6.

Number of Capacitive Elements

In this embodiment, although there are only two capacitors, this embodiment is not limited to this. For example, three or more capacitors can be connected in series to obtain a partial voltage of $1:(2^n-1)$ from predetermined connection portions of these capacitors. Existing capacitors can thereby be used effectively.

Switching Circuit

In this embodiment, although the switching circuit is a two-way input transmission gate 14, it is not limited to this. For example, a one-way input bipolar transistor or a MOS transistor can be employed.

According to the present invention, the conversion precision of a sequential comparison type AD converter can be reliably improved with a simple structure utilizing the distribution values of a plurality of capacitive elements.

What is claimed is:

1. A sequential comparison type AD converter comprising:

series resistors for generating at respective connection portions reference values to convert an analog value to an m-bit digital value;

a comparator for sequentially comparing the analog value and one of the reference values and outputting a digital value;

a plurality of capacitive elements for distributing any one of the reference values by a capacitance ratio, the plurality of capacitive elements including a first capacitive element and a second capacitive element; and a control unit for switching a value compared to the analog value by the comparator from the reference value to a distribution value of the plurality of capacitive elements when the comparator outputs an m-bit digital value, wherein the analog value is converted to an (m+n) bit digital value, wherein the first capacitive element and second capacitive element are connected in series between any one of the reference values and a ground, and wherein connection portions of the first capacitive element and second capacitive element are connected to inputs of the comparator to which the analog value is not input.

2. The sequential comparison type AD converter according to claim 1, wherein the plurality of capacitive elements distribute by the capacitance ratio the difference of reference values generated at predetermined connection portions of the series resistors.

3. The sequential comparison type AD converter according to claim 1, wherein the capacitance ratio of the first capacitive element and second capacitive element is $1:(2^n-1)$, in accordance with the (m+n) bits.

4. The sequential comparison type AD converter according to any one of claims 1 to 3, further comprising a switching circuit for switching on and off input of the reference value to the comparator, based on an output of the control unit.

5. A microcomputer comprising the sequential comparison type AD converter according to claim 1.

* * * * *